United States Patent
Wu

(10) Patent No.: US 6,747,328 B2
(45) Date of Patent: Jun. 8, 2004

(54) SCALED MOSFET DEVICE AND ITS FABRICATING METHOD

(75) Inventor: Ching-Yuan Wu, Hsinchu (TW)

(73) Assignee: Intelligent Sources Development, Corp., Hsinchu (TW)

( * ) Notice: Subject to any disclaimer, the term of this patent is extended or adjusted under 35 U.S.C. 154(b) by 0 days.

(21) Appl. No.: 10/188,051

(22) Filed: Jul. 3, 2002

(65) Prior Publication Data

US 2004/0004259 A1 Jan. 8, 2004

(51) Int. Cl.$^7$ ............................... H01L 29/94
(52) U.S. Cl. ................. 257/412; 257/408; 257/413
(58) Field of Search .................. 257/408, 412, 257/413

(56) References Cited

U.S. PATENT DOCUMENTS

| | | | |
|---|---|---|---|
| 5,480,820 A | * | 1/1996 | Roth et al. ............... 438/257 |
| 5,614,430 A | | 3/1997 | Liang et al. |
| 5,856,225 A | | 1/1999 | Lee et al. |
| 5,955,759 A | | 9/1999 | Ismail et al. |
| 5,966,615 A | | 10/1999 | Fazan et al. |
| 6,287,925 B1 | * | 9/2001 | Yu ............................ 438/301 |
| 6,468,915 B1 | * | 10/2002 | Liu ............................ 438/706 |
| 2003/0053345 A1 | * | 3/2003 | Moriya et al. ............. 365/200 |

* cited by examiner

Primary Examiner—Allan R. Wilson
(74) Attorney, Agent, or Firm—Pro-Techtor International Services

(57) ABSTRACT

A scaled MOSFET device of the present invention comprises a shallow-trench-isolation structure being formed on a semiconductor substrate; a conductive-gate structure having a pair of second conductive sidewall spacers formed over each inner sidewall of a gate region and on a first conductive layer and first raised field-oxide layers for forming an implant region in a central portion of a channel and a planarized third conductive layer for forming a salicide-gate structure or a polycide-gate structure; a buffer-dielectric layer being formed over each sidewall of the conductive-gate structure for forming lightly-doped source/drain diffusion regions; a first sidewall dielectric spacer being formed over each sidewall of the buffer-dielectric layers for forming heavily-doped source/drain diffusion regions; and a second sidewall dielectric spacer being formed over each sidewall of the first sidewall dielectric spacers for forming a self-aligned silicidation contact over each of the heavily-doped source/drain diffusion regions.

7 Claims, 6 Drawing Sheets

SCALED MOSFET DEVICE AND ITS FABRICATING METHOD

BACKGROUND OF THE INVENTION

1. Field of the Invention

The present invention relates generally to a MOSFET device and its fabricating method and, more particularly, to a scaled MOSFET device and its fabricating method.

2. Description of Related Art

The metal-oxide-semiconductor (MOS) field-effect transistors including n-channel MOSFET and p-channel MOSFET in CMOS integrated-circuits are scaled very rapidly based on the known scaling rule in order to gain density•speed•power product. Basically, the surface dimensions of a device including device channel length and device channel width can be directly scaled by an advanced lithographic technique, and the device isolation and contact areas must also be scaled accordingly in order to increase the packing density of integrated-circuits. However, as a gate length of a MOSFET device is further scaled down below 0.13 μm, there are several important issues encountered: a larger tunneling current between the channel and the elongated conductive-gate layer near the trench corners in the channel-width direction; a larger tunneling current and a larger overlapping capacitance between the elongated conductive-gate layer and the lightly-doped source/drain diffusion regions; a higher source/drain parasitic capacitance due to the pocket or halo implant; a poorer subthreshold slope or off leakage current due to the improper profile being formed under the gate region; and a contact integrity for shallow heavily-doped source/drain diffusion regions. These issues become serious as the gate length is scaled down below 0.13 μm and the gate-oxide thickness is smaller than 25 Angstroms.

Several methods had been proposed to improve or alleviate a part of the issues as described above. U.S. Pat. No. 5,966,615 had described a process for forming a shallow-trench-isolation (STI) structure to eliminate the larger tunneling current between the channel and the elongated conductive-gate layer near the trench corners in the channel-width direction; however, the active region of a device is reduced by the formed oxide spacer. U.S. Pat. No. 5,614,430 had proposed a process for forming a MOSFET device with an anti-punchthrough ion-implantation through an opened gate region to reduce the parasitic source/drain junction capacitances due to the pocket or halo implant; however, the other issues as stated are overlooked and the process steps for forming a MOSFET device are critical for practical applications. U.S. Pat. No. 5,856,225 had described a process for forming a MOSFET device with a self-aligned, ion-implanted channel region after forming the source and drain diffusion regions; however, the shallow-trench-isolation (STI) used, which is similar to that used in U.S. Pat. No. 5,966,615, is difficult to eliminate a larger leakage current between the channel and the elongated conductive-gate layer near the trench corners in the channel-width direction and a larger tunneling leakage current and a larger overlapping capacitance between the source/drain diffusion regions and the elongated conductive-gate layer through the overlapping area. Moreover, the metal-silicide layer formed over each of the heavily-doped source/drain diffusion regions is experienced by several thermal cycles such as the gate-oxide formation, the poly-gate formation, and the poly-gate silicidation and the integrity of the source/drain contacts becomes a major issue. U.S. Pat. No. 5,955,759 had described the elevated conductive layers over the source/drain diffusion regions by using a selective epitaxy technique to reduce the contact resistance for shallow source/drain junctions; however, the high parasitic capacitances between a T-shaped gate and the elevated source/drain conductive layers become a drawback for a high-performance MOSFET device.

It is, therefore, an objective of the present invention to offer a scaled MOSFET device and its fabricating method for eliminating and alleviating the issues encountered.

SUMMARY OF THE INVENTION

Accordingly, a scaled MOSFET device and its fabricating method are disclosed by the present invention. The scaled MOSFET device of the present invention comprises a shallow-trench-isolation structure for eliminating the tunneling leakage current between the channel and the elongated conductive-gate layer near the trench corners in the channel-width direction; a self-aligned source/drain diffusion structure with a buffer-dielectric layer to reduce the overlapping area between the elongated conductive-gate layer and the lightly-doped source/drain diffusion regions and an offset region for forming self-aligned source/drain silicidation contacts; and a highly conductive-gate structure having a pair of second conductive sidewall spacers for forming an implant region in a central portion of the channel for eliminating the parasitic source/drain junction capacitances and alleviating the hot-electron reliability and the punch-through effect.

The shallow-trench-isolation structure of the present invention comprises a first conductive layer over a gate-dielectric layer being formed over a channel region and the first raised field-oxide layers being formed in a shallow-trench-isolation region under the elongated conductive-gate layer. The self-aligned source/drain diffusion structure comprises a buffer-dielectric layer being formed over each sidewall of the gate region and on each side portion of the gate region for forming lightly-doped source/drain diffusion regions; a first sidewall dielectric spacer being formed over each sidewall of the buffer-dielectric layers for forming the heavily-doped source/drain diffusion regions; and a second sidewall dielectric spacer being formed over each sidewall of the first sidewall dielectric spacers to define the self-aligned source/drain silicidation contacts. The highly conductive-gate structure comprises a pair of second conductive sidewall spacers being formed over the inner sidewalls of the gate region and on a portion of a flat surface formed by the first conductive layer and the first raised field-oxide layers for forming an implant region in a self-aligned manner; and a composite conductive-gate structure including a salicide-gate structure and a polycide-gate structure being formed over the flat surface formed by the first conductive layer and the first raised field-oxide layers.

DETAILED DESCRIPTION OF THE PREFERRED EMBODIMENTS

Figure 1A:
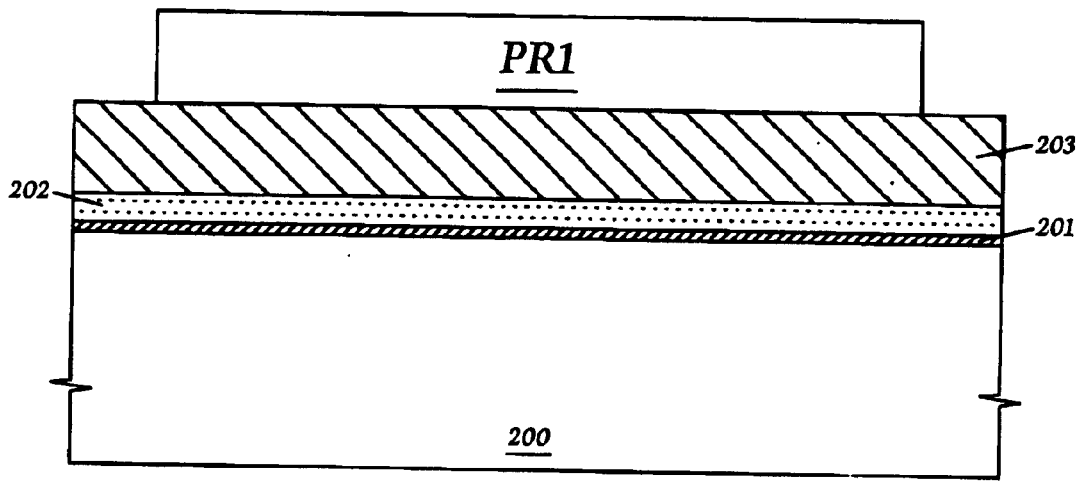
FIG. 1A through FIG. 1C show the process steps and their cross-sectional views of fabricating a shallow-trench-isolation structure for forming a scaled MOSFET device of the present invention.
Figure 1B:
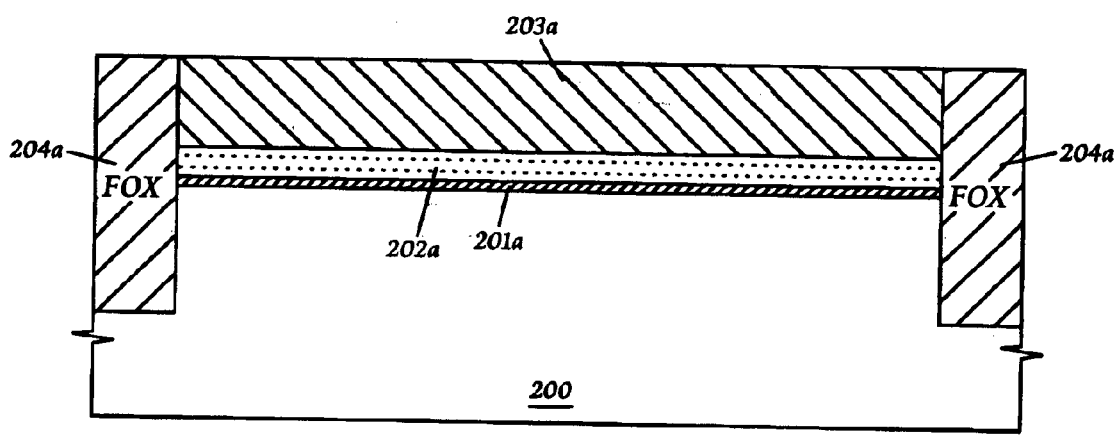
Figure 1C:
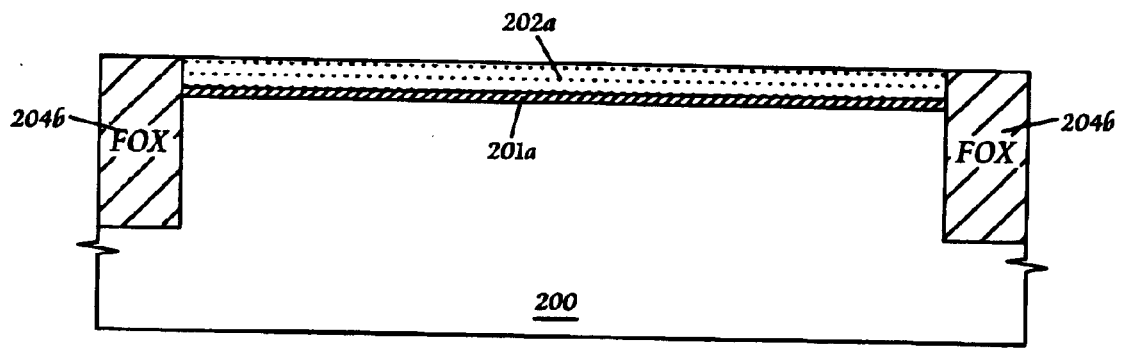

Referring now to FIG. 1A through FIG. 1C, there are shown the process steps and their cross-sectional views of fabricating a shallow-trench-isolation structure for forming a scaled MOSFET device of the present invention. FIG. 1A shows that a gate-dielectric layer 201 is formed over a semiconductor substrate 200 of a first conductivity type, a first conductive layer 202 is formed over the gate-dielectric layer 201, a first masking dielectric layer 203 is formed over the first conductive layer 202, and a masking photoresist PR1 is formed over the first masking dielectric layer 203 to define an active region (under PR1) and a shallow-trench-isolation (STI) region (outside of PR1). The gate-dielectric layer 201 is preferably a thermal-oxide layer or a nitrided thermal-oxide layer and its thickness is preferably between 15 Angstroms and 300 Angstroms. The first conductive layer 202 is preferably made of doped polycrystalline-silicon or doped amorphous-silicon as deposited by low-pressure chemical-vapor-deposition (LPCVD) and its thickness is preferably between 100 Angstroms and 1000 Angstroms. The first masking dielectric layer 203 is preferably made of silicon-nitrides as deposited by LPCVD and its thickness is preferably between 300 Angstroms and 2000 Angstroms.

FIG. 1B shows that the first masking dielectric layer 203, the first conductive layer 202, and the gate-dielectric layer 201 outside of the masking photoresist PR1 are sequentially removed by using reactive ion etching (RIE), then the semiconductor substrate 200 is anisotropically etched to form a shallow trench in the semiconductor substrate 200, and subsequently, the masking photoresist PR1 is stripped; a planarized field-oxide layer 204a is formed over the shallow trench. The depth of the shallow trench in the semiconductor substrate 200 is preferably between 3000 Angstroms and 10000 Angstroms. The planarized field-oxide layer (FOX) 204a is preferably made of silicon-dioxides or p-glass as deposited by high-density plasma CVD (HDPCVD) or plasma-enhanced (PE) CVD and is formed by first depositing a thick-oxide film 204 to fill up a gap formed by the shallow trench and then planarizing the deposited thick-oxide film 204 using chemical-mechanical polishing (CMP) with the first masking dielectric layer 203a as a polishing stop or using etching-back technique.

FIG. 1C shows that the planarized field-oxide layer 204a is etched back to a depth equal to a thickness of the first masking dielectric layer 203a to form a first raised field-oxide layer 204b and then the first masking dielectric layer 203a is removed by hot-phosphoric acid or RIE. It is clearly seen that the surface formed by the first raised field-oxide layer 204b and the first conductive layer 202a is flat for fine-line lithography later on. It should be noted that before forming the planarized field-oxide layer 204a, a thermal oxidation process can be performed to form a thin thermal-oxide layer over the trenched semiconductor surface to eliminate the defects due to the shallow-trench process. There are several methods for forming the flat surface shown in FIG. 1C. For example, the first masking dielectric layer 203 can be deleted and the planarized field-oxide layer 204a will have a surface level equal to a top surface of the first conductive layer 202a, however, this method is not good for forming a thin thermal-oxide layer over the trenched semiconductor surface. Similarly, the first masking dielectric layer 203a can be a silicon-oxide layer, however, the capping ability of the silicon-oxide layer against a thermal oxidation process is weak. It should be emphasized that the field-emission current due to the trench corners can be eliminated by the first raised field-oxide layer 204b formed.

Figure 2A:
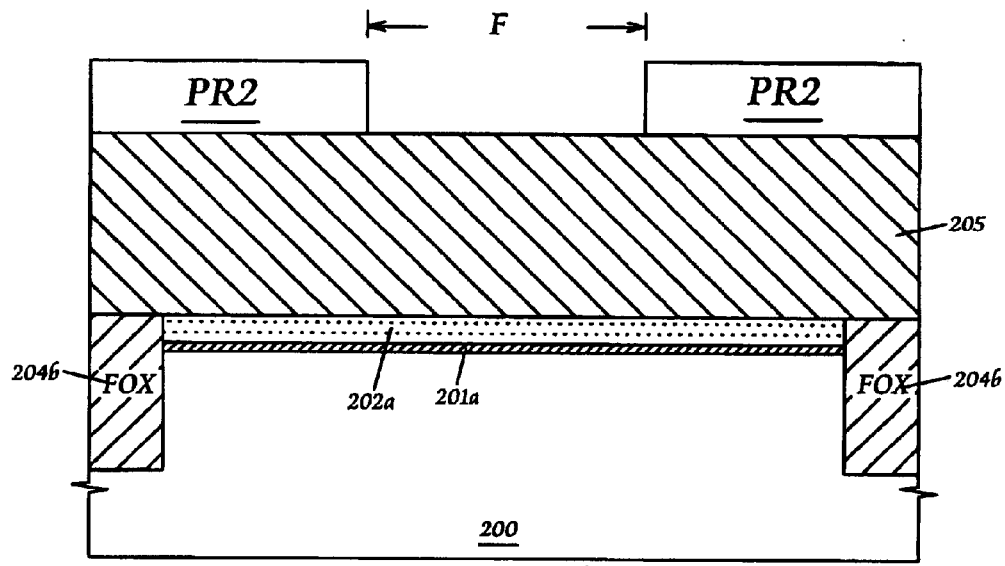
FIG. 2A through FIG. 2G show the process steps and their cross-sectional views of fabricating a scaled MOSFET device having different conductive-gate structures.

Referring now to FIG. 2A through FIG. 2G, there are shown the process steps and their cross-sectional views for forming a scaled MOSFET device over the STI structure shown in FIG. 1C. FIG. 2A shows that a second masking dielectric layer 205 is formed over the flat surface shown in FIG. 1C and the masking photoresist PR2 are formed over the second masking dielectric layer 205 to define a gate region (outside of PR2) and a source and a drain regions (under PR2). The second masking dielectric layer 205 is preferably made of silicon-nitrides as deposited by LPCVD and its thickness is preferably between 2000 Angstroms and 8000 Angstroms. The space between the masking photoresist PR2 can be defined to be a minimum-feature-size (F) and this space is formed over the active region and the isolation region to define a gate interconnection line.

Figure 2B:
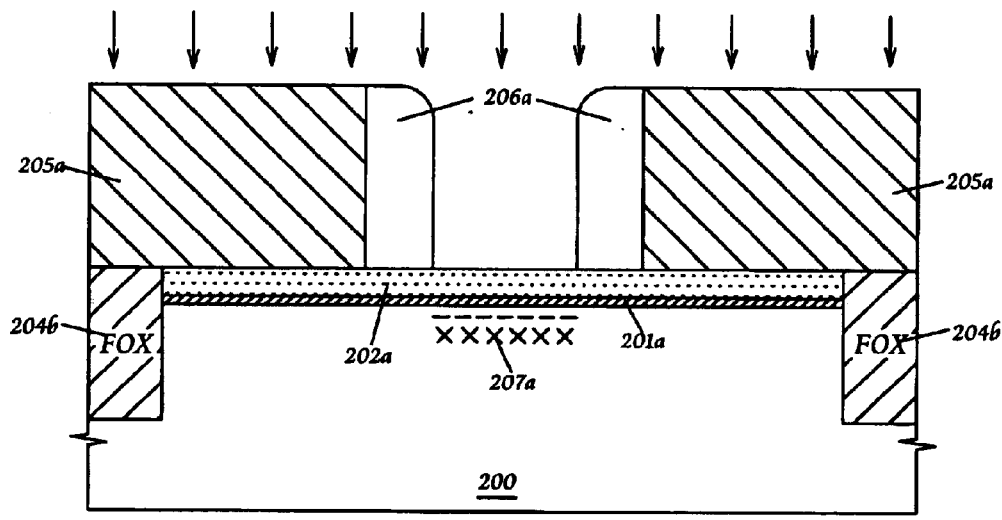

FIG. 2B shows that the second masking dielectric layer 205 outside of the masking photoresist PR2 is anisotropically removed to define the gate region or a gate line, the masking photoresist PR2 are then stripped, and a pair of second conductive sidewall spacers 206a are formed over each sidewall of the second masking dielectric layers 205a and on a portion of the first conductive layer 202a and the first raised field-oxide layers 204b; subsequently, an implant region 207a is formed in the semiconductor substrate 200 of the active region in a self-aligned manner by implanting doping impurities across the first conductive layer 202a and the gate-dielectric layer 201a between the pair of second conductive sidewall spacers 206a. The second conductive sidewall spacer 206a is preferably made of doped polycrystalline-silicon or tungsten-disilicide ($WSi_2$) as deposited by LPCVD and is formed by first depositing a second conductive layer 206 over the whole structure formed and then etching back a thickness of the deposited second conductive layer 206. The implant region 207a comprises a shallow implant region as indicated by the dash line for threshold-voltage adjustment and a deep implant region as indicated by the cross symbols for forming a punch-through stop. For an n-channel MOSFET device, the semiconductor substrate 200 is a p-type semiconductor or a p-well, the shallow implant region and the deep implant region are preferably of the first conductivity type. However, for a p-channel MOSFET device, the semiconductor substrate 200 is a n-type semiconductor or a n-well, the shallow implant region can be of a second conductivity type for forming the buried channel to reduce the threshold-voltage and can be of a first conductivity type to increase the threshold-voltage, and the deep implant region is always of the first conductivity type for increasing the punch-through voltage. The spacer width of the second conductive sidewall spacer 206a is preferably between 100 Angstroms and 1000 Angstroms for a gate length smaller than 0.25 $\mu$m and can be easily controlled by a thickness of the deposited second conductive layer 206.

Figure 2C:
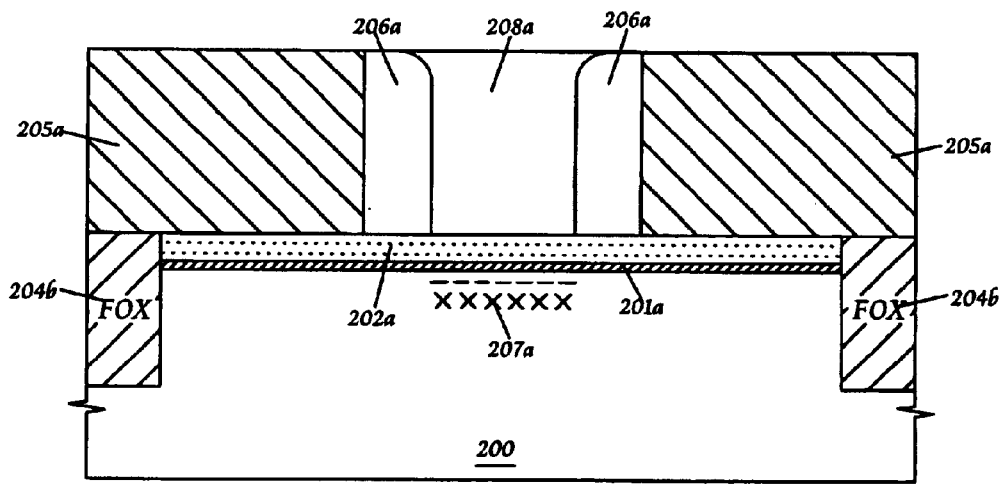

FIG. 2C shows that a planarized third conductive layer 208a is formed over a gap between the pair of second conductive sidewall spacers 206a. The planarized third conductive layer 208a is preferably made of doped polycrystalline-silicon or tungsten-disilicide ($WSi_2$) as deposited by LPCVD and is formed by first depositing a thick third conductive layer 208 to fill up the gap between the pair of second conductive sidewall spacers 306a and then planarizing the deposited third conductive layer 208 using CMP with the second masking dielectric layer 205a as a polishing stop or using an etching-back technique.

Figure 2D:
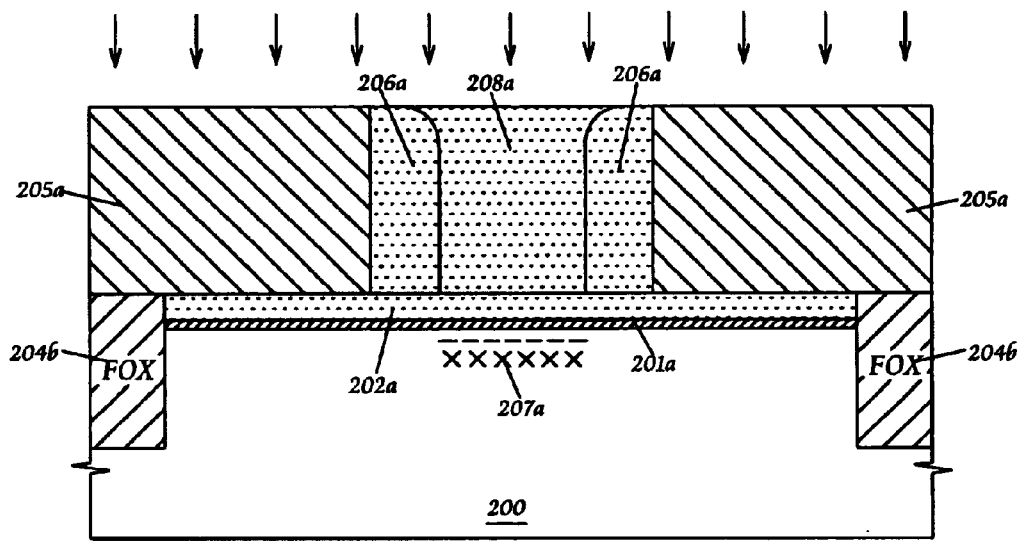
Figure 2D:
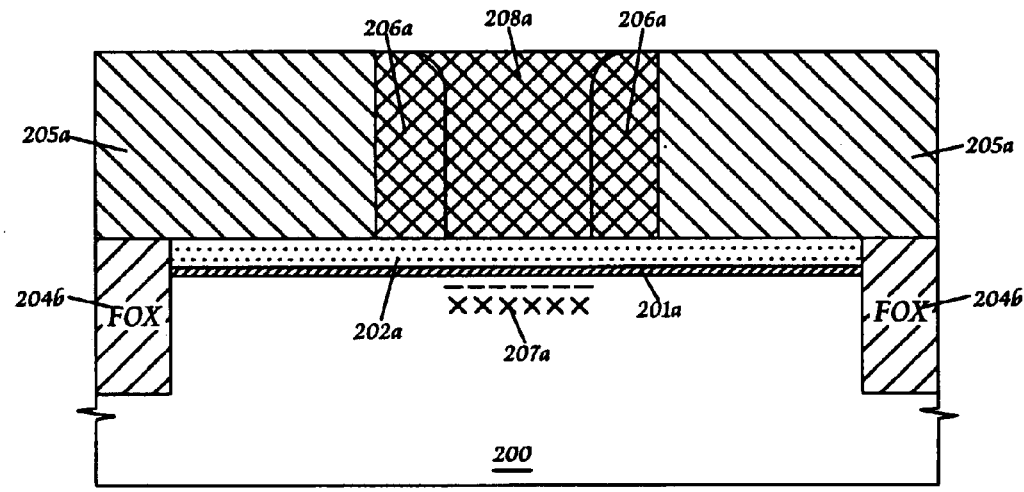

FIG. 2D(a) shows that the pair of second conductive sidewall spacers 206a and the planarized third conductive layer 208a are made of doped polycrystalline-silicon to form a conductive-gate layer 206a, 208a. FIG. 2D(a) also shows that an ion-implantation can be performed to heavily dope the second conductive sidewall spacers 206a and the planarized third conductive layer 208a. FIG. 2D(b) shows that the pair of second conductive sidewall spacers 206a and the planarized third conductive layer 208a are made of tungsten-disilicide.

Figure 2E:
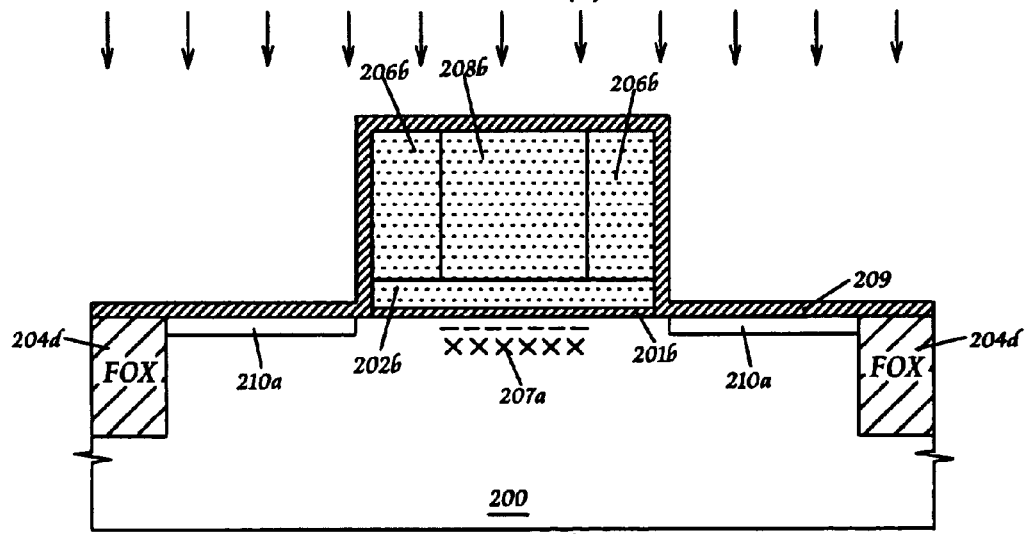
Figure 2E:
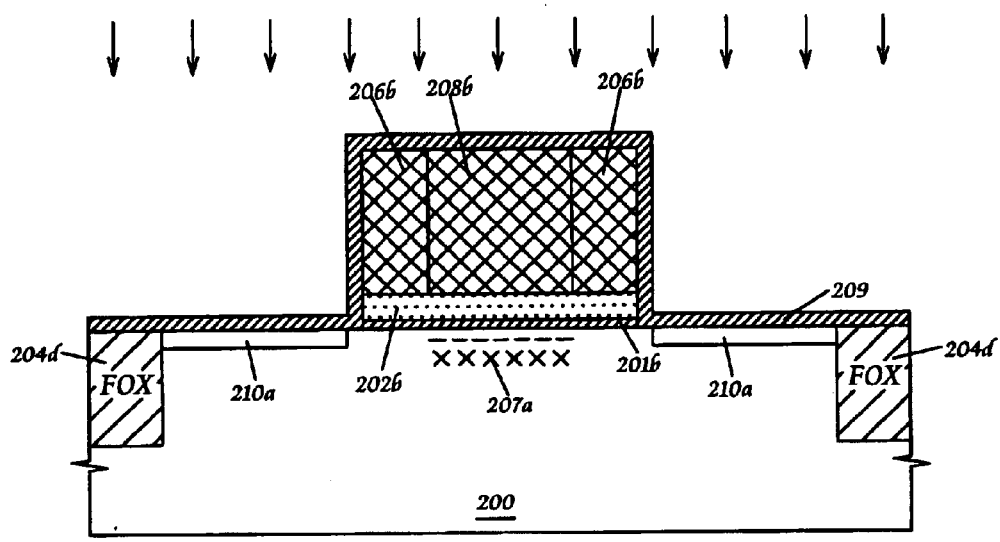

FIG. 2E(a) shows that the second masking dielectric layers 205a outside of the gate region are removed selectively either using hot-phosphoric acid or anisotropic dry etching, the first raised field-oxide layers 204b outside of the gate region are then etched back to a depth equal to a thickness of the first conductive layer 202a to form second raised field-oxide layers 204c, the first conductive layer 202a is removed thereafter and the conductive-gate layer 206a, 208a is simultaneously etched, and the gate-dielectric layer 201a is subsequently removed by dipping in dilute hydrofluoric acid or using anisotropic dry etching and the second raised field-oxide layers 204c are simultaneously etched to form third raised field-oxide layers 204d. FIG. 2E(a) also shows that a buffer-dielectric layer 209 is formed over the exposed gate structure, the exposed semiconductor substrate, and the third raised field-oxide layers 204d, and an ion-implantation is then performed to form lightly-doped source/drain implant regions 210a of a second conductivity type in a self-aligned manner by implanting doping impurities across the buffer-dielectric layer 209 into the semiconductor substrate 200. The buffer-dielectric layer 209 is preferably a silicon-dioxide or silicon-nitride layer as deposited by high-temperature oxide (HTO) deposition or LPCVD and its thickness is preferably between 100 Angstroms and 2000 Angstroms. The buffer-dielectric layer 209 can be a thermal-oxide layer by using a conventional thermal oxidation process. It is clearly seen that the buffer-dielectric layer 209 creates an extending length for the lightly-doped source/drain implant regions 210a and therefore reduce the excessive extension of the lightly-doped source/drain diffusion regions 210b under the first conductive layer 202b.

FIG. 2E(b) shows that a similar process shown in FIG. 2E(a) is performed for FIG. 2D(b). Similarly, an ion-implantation is performed to form the lightly-doped source/drain implant regions 210a of the second conductivity type in the semiconductor substrate 200.

Figure 2F:
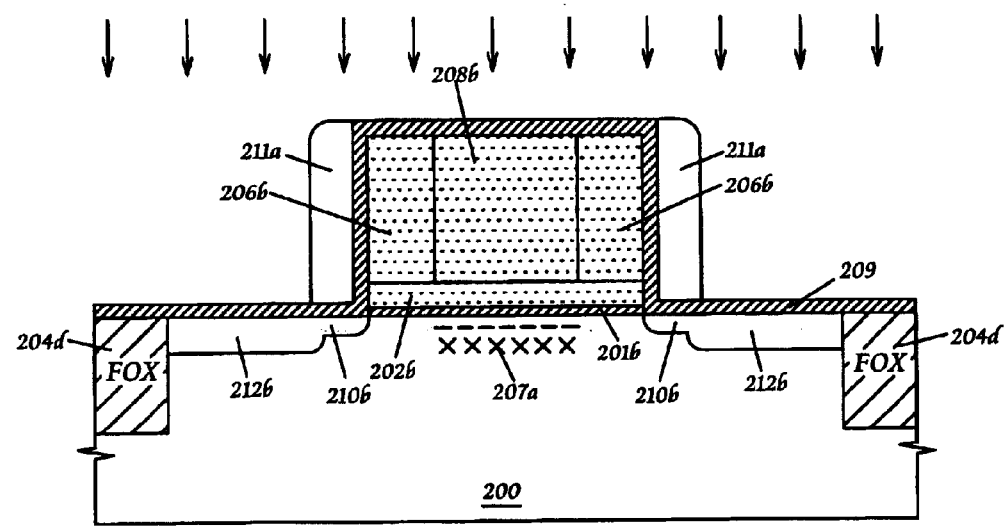
Figure 2F:
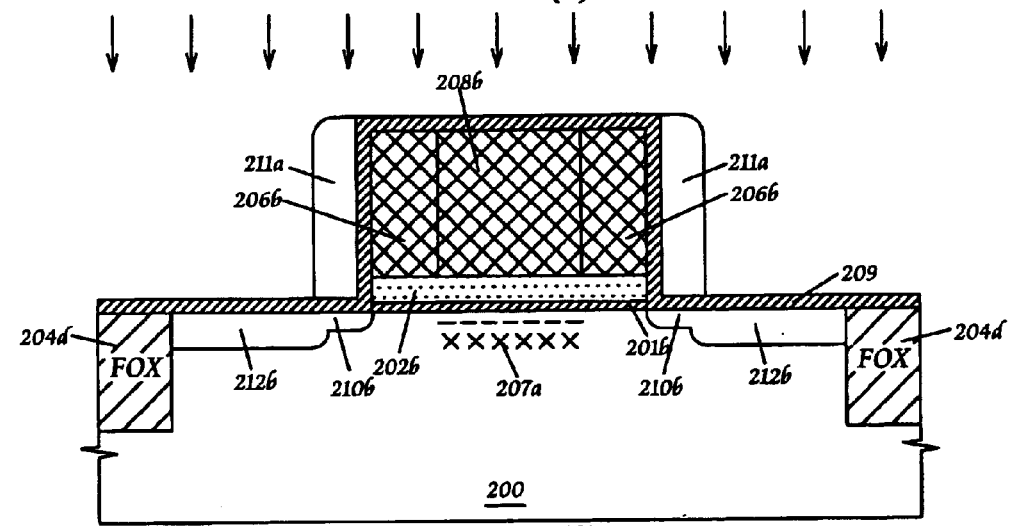

FIG. 2F(a) shows that a first sidewall dielectric spacer 211a is formed over each sidewall of the buffer-dielectric layers 209 and an ion-implantation is then performed to form heavily-doped source/drain implant regions 212b of the second conductivity type in a self-aligned manner by implanting doping impurities across the buffer-dielectric layer 209 into the semiconductor substrate 200. The first sidewall dielectric spacer 211a is preferably made of silicon-dioxides or silicon-nitrides as deposited by LPCVD and is formed by first depositing a first dielectric layer 211 over the buffer-dielectric layer 209 and then etching back a thickness of the deposited first dielectric layer 211. FIG. 2F(a) also shows that a thermal annealing process is performed to activate and diffuse the implanted doping impurities in the semiconductor substrate 200 to form lightly/heavily doped source/drain diffusion regions 210b, 212b.

FIG. 2F(b) shows that a similar process shown in FIG. 2F(a) is performed to form a first sidewall dielectric spacer 211a and the lightly/heavily-doped source/drain diffusion regions 210b/212b in the semiconductor substrate 200.

Figure 2G:
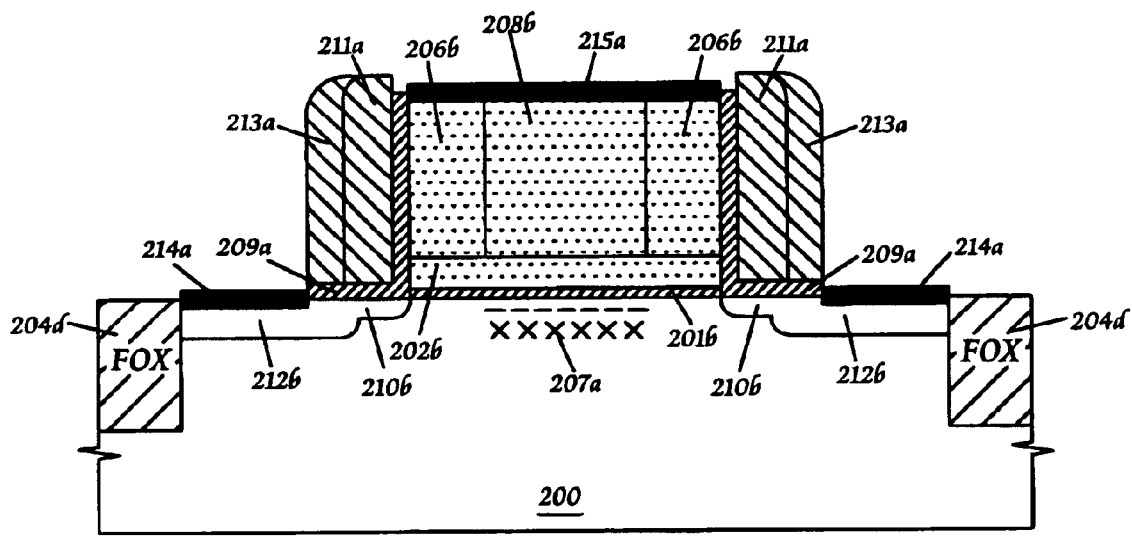
Figure 2G:
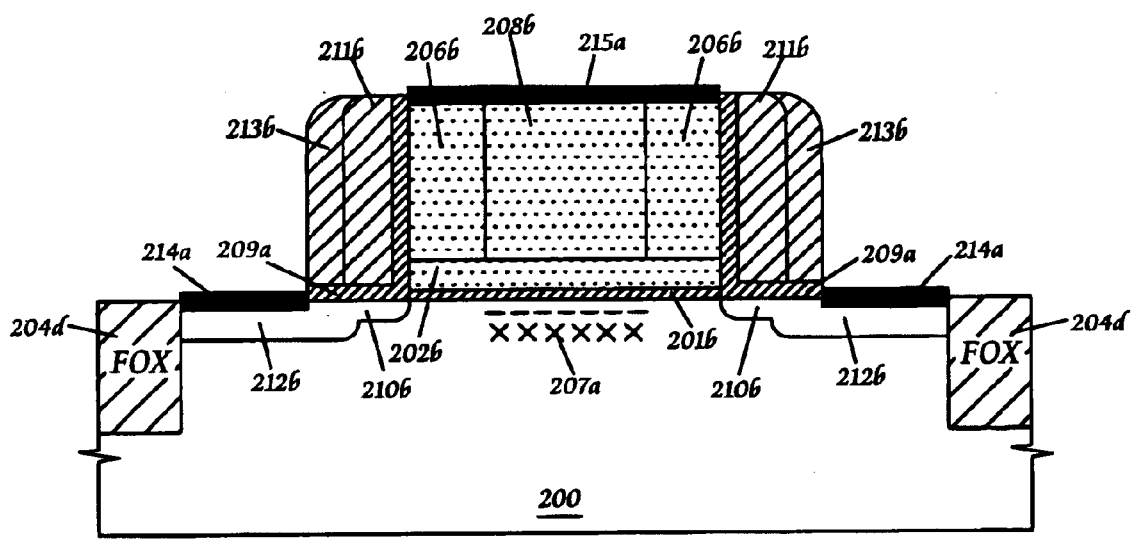
Figure 2G:
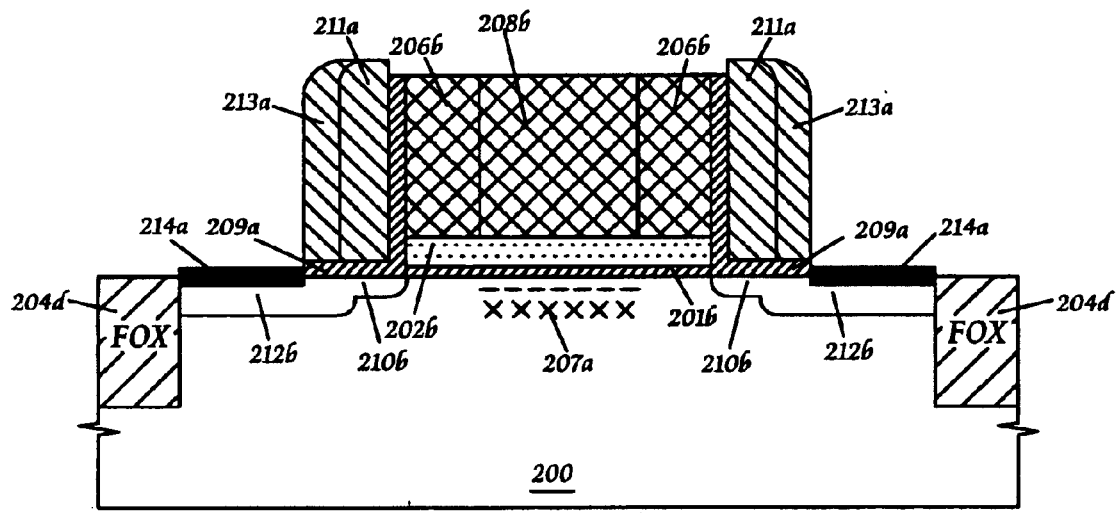
Figure 2G:
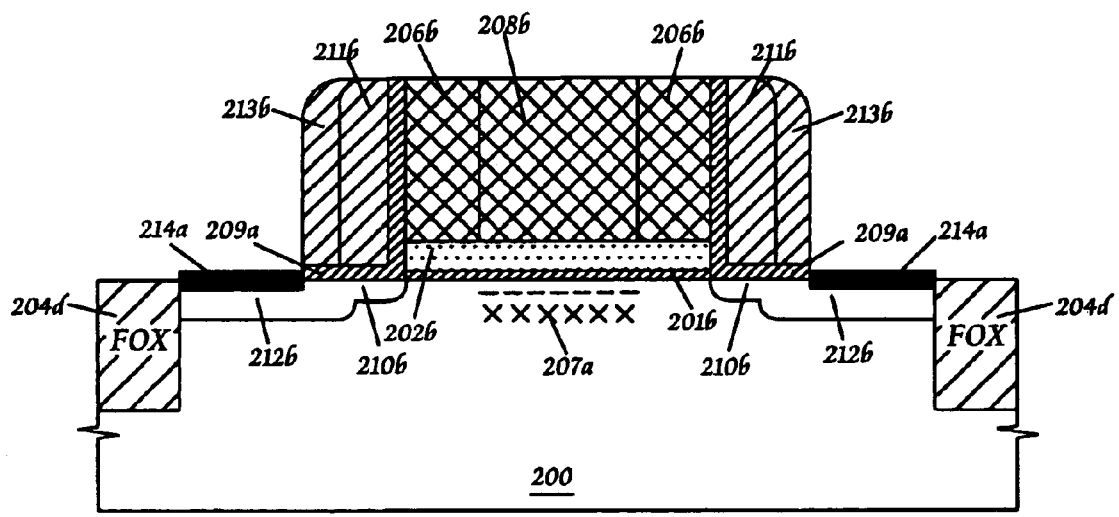

FIG. 2G(a)-1 and FIG. 2G(a)-2 show that a second sidewall dielectric spacer 213a is formed over each sidewall of the first sidewall dielectric spacers 211a shown in FIG. 2F(a) and an etching-back process is simultaneously performed to remove the buffer-dielectric layers 209 over a top surface of the conductive-gate layer 206b, 208b, the semiconductor substrate 200, and the third raised field-oxide layers 204d. Subsequently, a well-known self-aligned silicidation process is performed to form a first metal-disilicide layer 216a over the conductive-gate layer 206b, 208b and a second metal-disilicide layer 214a over each of the heavily-doped source/drain diffusion regions 212b. FIG. 2G(a)-1 shows that the first/second sidewall dielectric spacers 211a, 213a are made of silicon-nitrides as deposited by LPCVD; FIG. 2G(a)-2 shows that the first/second sidewall dielectric spacers 211a, 213a are made of silicon-dioxides as deposited by LPCVD and are simultaneously etched by the etching-back process to form etched-back first/second sidewall dielectric spacers 211b, 213b.

FIG. 2G(b)-1 and FIG. 2G(b)-2 show that a second sidewall dielectric spacer 213a is formed over each sidewall of the first sidewall dielectric spacers 211a shown in FIG. 2F(b) and an etching-back process is simultaneously performed to remove the buffer-dielectric layers 209 over a top surface of the conductive-gate layer 206b, 208b, the semiconductor substrate 200, and the third raised field-oxide layers 204d. Similarly, a well-known self-aligned silicidation process is performed to form a second metal-disilicide layer 214a over each of the heavily-doped source/drain diffusion regions 212b. FIG. 2G(b)-1 shows that the first/second sidewall dielectric spacers 211a/213a are made of silicon-nitrides as deposited by LPCVD; FIG. 2G(b)-2 shows that the first/second dielectric spacers 211a/213a are made of silicon-dioxides as deposited by LPCVD and simultaneously etched by the etching-back process to form etched-back first/second sidewall dielectric spacers 211b/213b.

From FIG. 2G(a) and FIG. 2G(b), it is clearly seen that the second sidewall dielectric spacer 213a creates an offset region for forming a second metal-disilicide layer 214a over a flat junction-depth region in each of the heavily-doped source/drain diffusion regions 212b to improve the contact integrity of shallow heavily-doped source/drain diffusion regions 212b. It should be noted that an ion-implantation process can be performed in a self-aligned manner after the formation of the second sidewall dielectric spacers 213b to form the deeper heavily-doped source/drain implant regions (not shown) for further improving the contact integrity and the thermal annealing process stated in FIG. 2F(a) and FIG. 2F(b) should be practiced after the formation of the deeper heavily-doped source/drain implant regions.

Accordingly, the advantages and features of the scaled MOSFET device of the present invention can be summarized below:

(a) The scaled MOSFET device offers a shallow-trench-isolation structure to eliminate the field-emission current between the trench corners and the conductive-gate layer near the gate edges in the channel-width direction.
(b) The scaled MOSFET device offers a pair of second conductive sidewall spacers formed over the inner sidewalls of the gate region for forming a deep implant region to eliminate the punch-through effect and the parasitic source/drain junction capacitances.
(c) The scaled MOSFET device offers a pair of second conductive sidewall spacers formed over the inner sidewalls of the gate region for forming a shallow implant region to efficiently adjust the threshold-voltage of a scaled device and simultaneously reduce the drain electric field for alleviating hot-electron reliability.
(d) The scaled MOSFET device offers a buffer-dielectric layer formed over each sidewall of the gate region for forming the lightly-doped source/drain diffusion regions to reduce simultaneously the overlapping capacitances and the tunneling leakage current between the lightly-doped source/drain diffusion regions and the conductive-gate layer.

(e) The scaled MOSFET device offers a first sidewall dielectric spacer over each sidewall of the buffer-dielectric layers for forming the shallow heavily-doped source/drain diffusion regions and a second sidewall dielectric spacer over each sidewall of the first sidewall dielectric spacers for simultaneously forming the deeper heavily-doped source/drain diffusion regions and the self-aligned source/drain silicidation contacts to improve the contact integrity.

(f) The scaled MOSFET device can be easily fabricated to have a salicide-gate structure or a polycide-gate structure without increasing the masking steps and the thermal cycles.

Besides, the scaled MOSFET device and its fabricating method can be easily extended to form high-performance CMOS ICs.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the invention.

What is claimed is:

1. A scaled MOSFET device, comprising:

a semiconductor substrate, of a first conductivity type;

a shallow-trench-isolation (STI) structure being formed over said semiconductor substrate, wherein said STI structure comprises an active region and an isolation region;

a gate region being formed over a portion of said STI structure, wherein said gate region comprises a pair of second conductive sidewall spacers being formed over inner sidewall of said gate region and on a portion of a flat surface being formed by a first conductive layer in said active region and a portion of a first raised field-oxide layers in said isolation region for forming an implant region in a central portion of a channel in a self-aligned manner, and a planarized third conductive layer being formed over a gap between said pair of second conductive, sidewall spacers; and a source region and a drain region being separately formed in a side portion of said gate region, wherein said source/drain region comprises a buffer-dielectric layer being formed over a sidewall of said gate region and on said semiconductor substrate in said active region and a third raised field-oxide layers in said isolation region for forming a lightly-doped source/drain diffusion region of a second conductivity type in a self-aligned manner, a first sidewall dielectric spacer being formed over a sidewall of said buffer-dielectric layer and on said buffer-dielectric layer for forming a heavily-doped source/drain diffusion region of said second conductivity type in a self-aligned manner, and a second sidewall dielectric spacer being formed over a sidewall of said first sidewall dielectric spacer and on said buffer-dielectric layer for forming a self-aligned metal-silicide contact over a portion of said heavily-doped source/drain diffusion region.

2. The scaled MOSFET device according to claim 1, wherein said pair of second conductive sidewall spacers and said planarized third conductive layer being made of doped polycrystalline-silicon and implanted with a high dose of doping impurities are silicided with a first metal-suicide layer by using a self-aligned silicidation process for forming a salicide-gate structure.

3. The scaled MOSFET device according to claim 1, wherein said pair of second conductive sidewall spacers and said planarized third conductive layer are made of tungsten-disilicides (WSi$_2$) for forming a polycide-gate structure.

4. The scaled MOSFET device according to claim 1, wherein said first and said second sidewall dielectric spacers are preferably made of silicon-dioxide.

5. The scaled MOSFET device according to claim 1, wherein said first and said second sidewall dielectric spacers are preferably made of silicon-nitride.

6. The scaled MOSFET device according to claim 1, wherein said implant region comprises a shallow implant region of said first or said second conductivity type for threshold-voltage adjustment and a deep implant region of said first conductivity type for forming a punch-through stop.

7. The scaled MOSFET device according to claim 1, wherein said second sidewall dielectric spacer is used to form deeper heavily-doped source/drain diffusion regions of said second conductivity type in a self-aligned manner.

* * * * *